(12) United States Patent
Wu et al.

(10) Patent No.: US 11,493,794 B2
(45) Date of Patent: Nov. 8, 2022

(54) ELECTRONIC DEVICE AND METHOD OF MANUFACTURING THE SAME

(71) Applicant: TPK Advanced Solutions Inc., Fujian (CN)

(72) Inventors: Chun Yan Wu, Xiamen (CN); Jen-Chang Liu, Tainan (TW); Tai-Shih Cheng, Taipei (TW); Lien-Hsin Lee, Xiamen (CN)

(73) Assignee: TPK Advanced Solutions Inc., Fujian (CN)

( * ) Notice: Subject to any disclaimer, the term of this patent is extended or adjusted under 35 U.S.C. 154(b) by 20 days.

(21) Appl. No.: 17/146,206

(22) Filed: Jan. 11, 2021

(65) Prior Publication Data

US 2022/0221749 A1     Jul. 14, 2022

(51) Int. Cl.
| | | |
|---|---|---|
| *G06F 3/045* | (2006.01) |
| *G02F 1/1333* | (2006.01) |
| *H01L 51/00* | (2006.01) |
| *H01L 51/52* | (2006.01) |
| *H01L 51/56* | (2006.01) |
| *G02F 1/167* | (2019.01) |
| *G02F 1/1677* | (2019.01) |
| *G02F 1/1335* | (2006.01) |
| *G06F 3/041* | (2006.01) |
| *H01L 27/32* | (2006.01) |

(52) U.S. Cl.
CPC .... *G02F 1/13338* (2013.01); *G02F 1/133331* (2021.01); *G02F 1/133502* (2013.01); *G02F 1/133528* (2013.01); *G02F 1/167* (2013.01); *G02F 1/1677* (2019.01); *G06F 3/041* (2013.01); *H01L 27/323* (2013.01); *H01L 51/0097* (2013.01); *H01L 51/524* (2013.01); *H01L 51/5281* (2013.01); *H01L 51/56* (2013.01); *G02F 2202/28* (2013.01); *G06F 2203/04102* (2013.01); *G06F 2203/04103* (2013.01); *H01L 2251/5338* (2013.01)

(58) Field of Classification Search
CPC .... G06F 1/1616; G06F 1/1641; G06F 1/1652; G06F 1/1656; G06F 1/1681; H01L 2251/5338; H04M 1/0216; H04M 1/0268
See application file for complete search history.

(56) References Cited

U.S. PATENT DOCUMENTS

| | | | |
|---|---|---|---|
| 2019/0250793 A1* | 8/2019 | Choi | H04M 1/724 |
| 2020/0042116 A1* | 2/2020 | Li | G06F 3/0412 |
| 2020/0225699 A1* | 7/2020 | Yu | H04M 1/0268 |
| 2020/0262746 A1* | 8/2020 | He | B32B 27/285 |
| 2020/0266542 A1* | 8/2020 | Mu | H01Q 7/00 |
| 2020/0391482 A1* | 12/2020 | Cavalca | H04M 1/0266 |

FOREIGN PATENT DOCUMENTS

TW          201940937 A     10/2019

* cited by examiner

*Primary Examiner* — Insa Sadio
(74) *Attorney, Agent, or Firm* — Cooper Legal Group, LLC

(57) ABSTRACT

An electronic device includes a cover plate, a touch sensing layer, and a display module. The cover plate includes a glass layer and at least one transparent covering layer. The glass layer has a first surface and a second surface. The transparent covering layer is disposed on and in contact with at least one of the first surface or the second surface of the glass layer and is laminated with the glass layer. The touch sensing layer is disposed under the cover plate. The display module is disposed under the touch sensing layer.

24 Claims, 6 Drawing Sheets

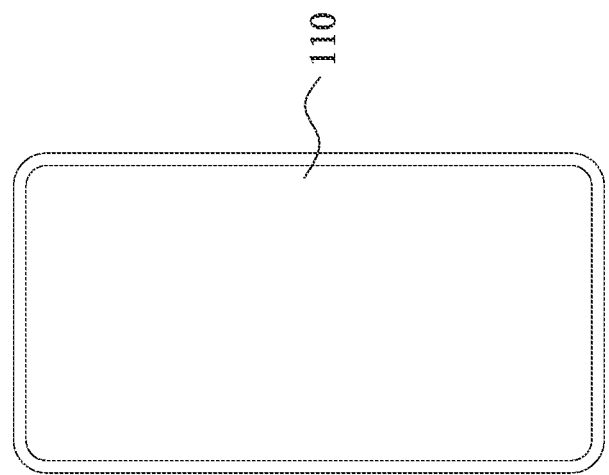

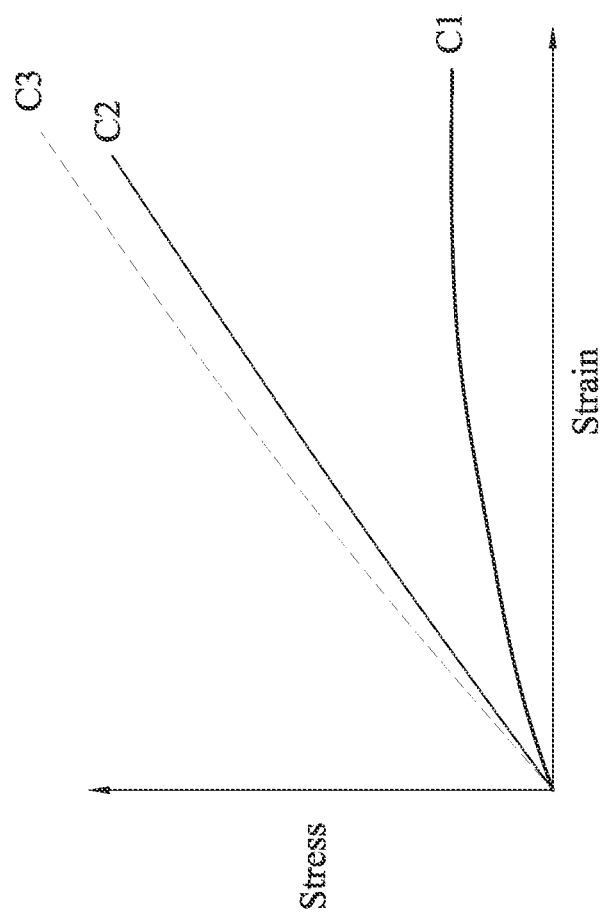

ELECTRONIC DEVICE AND METHOD OF MANUFACTURING THE SAME

BACKGROUND

Technical Field

The present disclosure relates to an electronic device and a method of manufacturing the same, and more particularly, to an electronic device including a flexible screen.

Description of Related Art

Recently, mobile phones with foldable screens have been launched on the market. For mobile phone manufacturers, mobile phones with foldable screens can not only establish brand images, but also increase product prices. Mobile phones with foldable screens will also replace tablets and even notebook computers as a new source of business growth. For supply chain manufacturers, mobile phones with foldable screens will bring new demands and improve their profitability.

In order to achieve foldable effects, cover plates of some existing foldable screens are implemented with plastic films (such as polymer films). In addition to flexibility, these films need to be thin, have high hardness, have high temperature resistance, and have high light transmittance. However, from the experimental data, if the foldable screen made of plastic film is folded a certain number of times, the cover plate cannot have a high stress release ability due to the use of plastic film (it can also be said that the cover plate made of plastic film has a low Young's modulus), so that crease damage will be formed after repeated folding and the flatness of the cover plate will be affected, which will further cause the optical performance (e.g., brightness, contrast, etc.) to be greatly reduced. From US Patent Application Publication No. 20200225699A, it is known that the use of optical clear adhesive (OCA) or pressure sensitive adhesive (PSA) as a coupling between stacked structures not only increases the overall thickness, but also easily forms crack gaps after repeated folding.

Accordingly, how to provide an electronic device to solve the aforementioned problems becomes an important issue to be solved by those in the industry.

SUMMARY

An aspect of the disclosure is to provide an electronic device that can efficiently solve the aforementioned problems.

According to an embodiment of the disclosure, an electronic device includes a cover plate, a touch sensing layer, and a display module. The cover plate includes a glass layer and at least one transparent covering layer. The glass layer has a first surface and a second surface. The at least one transparent covering layer is disposed on and in contact with at least one of the first surface or the second surface of the glass layer and is laminated with the glass layer. The touch sensing layer is disposed under the cover plate. The display module is disposed under the touch sensing layer.

In an embodiment of the disclosure, the glass layer is an ultra-thin glass layer having a thickness of less than about 100 microns.

In an embodiment of the disclosure, the thickness of the glass layer is from about 25 microns to about 100 microns.

In an embodiment of the disclosure, the thickness of the glass layer is from about 25 microns to about 35 microns.

In an embodiment of the disclosure, the at least one transparent covering layer has a thickness from about 5 microns to about 10 microns.

In an embodiment of the disclosure, the cover plate has a Young's modulus of about 10 Gpa to about 200 Gpa.

In an embodiment of the disclosure, the at least one transparent covering layer includes polyimide or colorless polyimide (CPI).

In an embodiment of the disclosure, the at least one transparent covering layer is added with an inorganic mixture. A Young's modulus of the cover plate compounded with the inorganic mixture is from about 80 Gpa to about 200 Gpa.

In an embodiment of the disclosure, the display module is an organic light emitting display module or an electronic paper display module.

In an embodiment of the disclosure, the touch sensing layer is in contact with the second surface of the glass layer.

In an embodiment of the disclosure, the touch sensing layer is in contact with the at least one transparent covering layer.

In an embodiment of the disclosure, the at least one transparent covering layer includes a first transparent covering layer and a second transparent covering layer. The glass layer is laminated between the first transparent covering layer and the second transparent covering layer.

In an embodiment of the disclosure, the electronic device further includes an anti-reflection layer. The anti-reflection layer is disposed on a side of the cover plate away from the touch sensing layer.

In an embodiment of the disclosure, the electronic device further includes a polarizing layer. The polarizing layer is disposed between the touch sensing layer and the display module.

In an embodiment of the disclosure, the polarizing layer is in contact with the touch sensing layer.

In an embodiment of the disclosure, the polarizing layer is attached to the touch sensing layer through an adhesive.

In an embodiment of the disclosure, the electronic device further includes a blackened layer. The blackened layer is disposed at an edge of the glass layer.

In an embodiment of the disclosure, the electronic device further includes a first screen and a second screen. The second screen is rotatably connected to the first screen. The cover plate covers the first screen and the second screen.

In an embodiment of the disclosure, the first screen and the second screen are touch display screens.

In an embodiment of the disclosure, each of the touch display screens includes a force sensing layer.

In an embodiment of the disclosure, the electronic device is a folding mobile phone.

According to an embodiment of the disclosure, a method of manufacturing an electronic device includes: providing a cover plate, in which the cover plate includes a glass layer and at least one transparent covering layer laminated with each other; forming a touch sensing layer under the cover plate; and forming a display module under the touch sensing layer.

In an embodiment of the disclosure, the providing the cover plate includes: coating a polymer material layer on the glass layer; and drying the polymer material layer to form the at least one transparent covering layer.

In an embodiment of the disclosure, the forming the touch sensing layer under the cover plate includes: coating a conductive coating layer under the cover plate; and drying the conductive coating layer to form the touch sensing layer.

Accordingly, in the electronic device of the present disclosure, the transparent covering layer is disposed on and in contact with the glass layer. In other words, the transparent covering layer and the glass layer are not adhered to each other with adhesive (e.g., OCA). Therefore, it not only can reduce the overall thickness of the cover plate and reduce the formation of pores and unnecessary cracks during the bending process, but also effectively improve the surface performance (e.g., bending resistance, stress resistance, abrasion resistance, and hardness) of the cover plate. In addition, the lack of the use of adhesive can simplify the manufacturing process, thereby reducing manufacturing costs.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows:

FIG. 1A is a schematic diagram showing an electronic device in a use state according to an embodiment of the present disclosure;

FIG. 5 shows stress-strain curves of various structures.

DETAILED DESCRIPTION

Figure 1B:
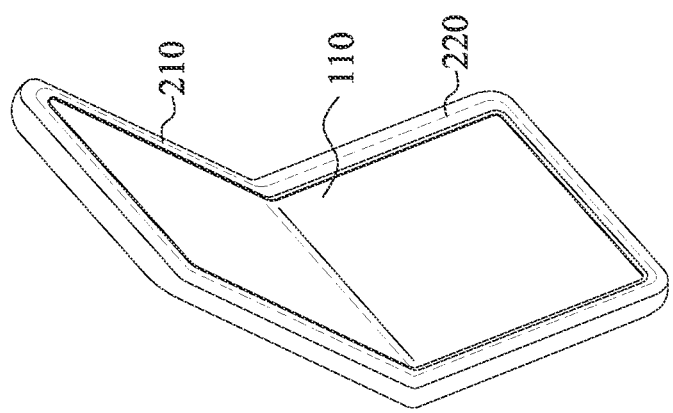
FIG. 1B is a schematic diagram showing the electronic device in FIG. 1A in another use state.

Reference will now be made in detail to the present embodiments of the disclosure, examples of which are illustrated in the accompanying drawings. Wherever possible, the same reference numbers are used in the drawings and the description to refer to the same or like parts. However, specific structural and functional details disclosed herein are merely representative for purposes of describing example embodiments, and thus may be embodied in many alternate forms and should not be construed as limited to only example embodiments set forth herein. Therefore, it should be understood that there is no intent to limit example embodiments to the particular forms disclosed, but on the contrary, example embodiments are to cover all modifications, equivalents, and alternatives falling within the scope of the disclosure.

Reference is made to FIGS. 1A and 1B. FIG. 1A is a schematic diagram showing an electronic device 100 in a use state according to an embodiment of the present disclosure. FIG. 1B is a schematic diagram showing the electronic device 100 in FIG. 1A in another use state. In the present embodiment, the electronic device 100 is a foldable mobile phone including a cover plate 110 for example, but the disclosure is not limited in this regard. In some other embodiments, the electronic device 100 can also be a tablet computer or a notebook computer. For example, the electronic device 100 is a dual-screen notebook computer including a first screen 210 and a second screen 220 (indicated by dotted lines in FIG. 1B). The second screen 220 is rotatably connected to the first screen 210 (e.g., through a hinge) and configured to display a virtual keyboard (not shown).

In some embodiments, the first screen 210 and the second screen 220 are touch display screens. In some embodiments, each of the touch display screens includes a force sensing layer for implementing pressure sensing or tactile feedback with the effect of an actuator.

Figure 2:
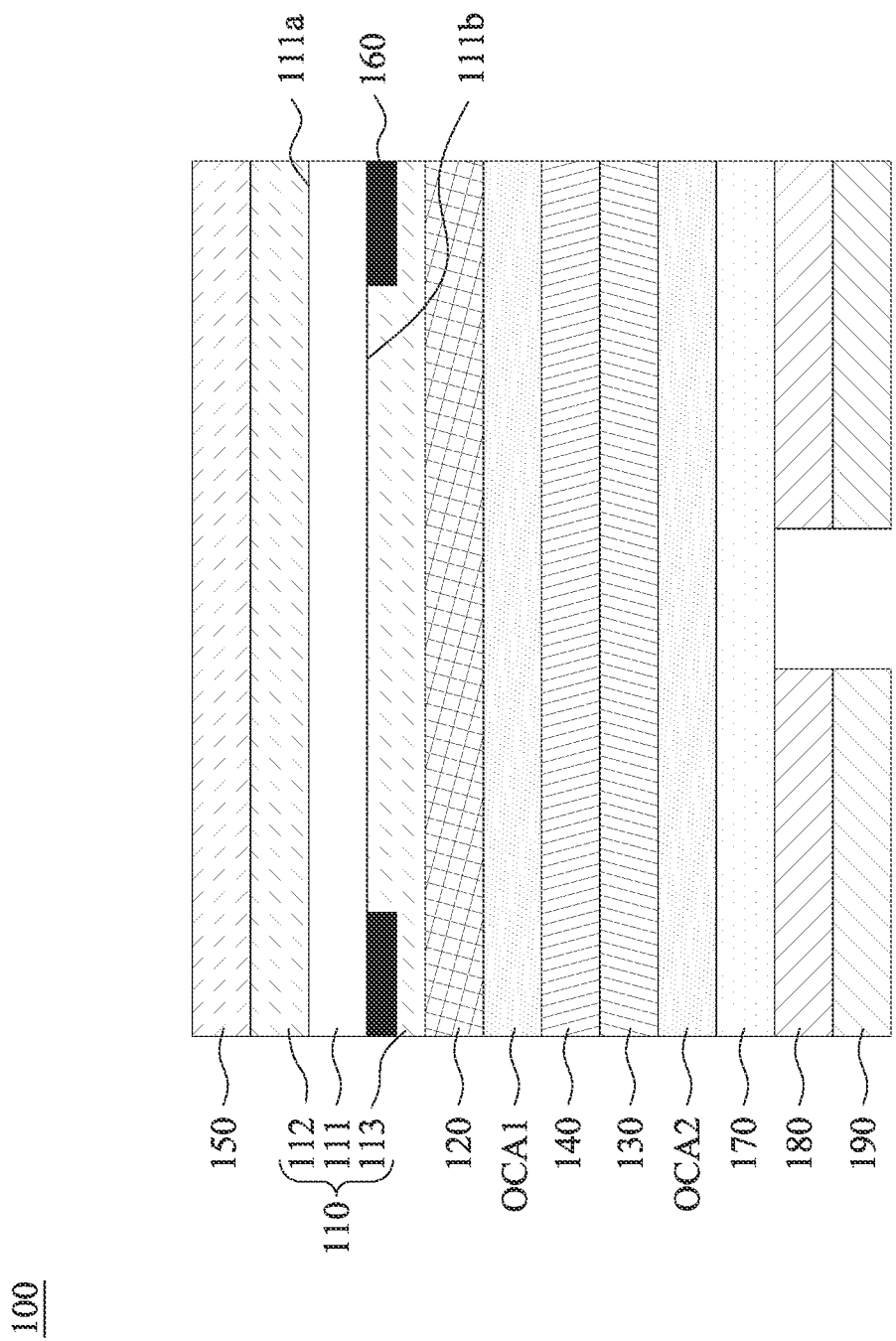
FIG. 2 is a schematic cross-sectional view of the electronic device in FIG. 1A.

Reference is made to FIG. 2. FIG. 2 is a schematic cross-sectional view of the electronic device 100 in FIG. 1A. As shown in FIG. 2, in the present embodiment, the electronic device 100 further includes a touch sensing layer 120, a display module 130, a polarizing layer 140, a metal plate 170, a pressure colloid 180, a supporting member 190, and adhesives OCA1, OCA2 (e.g., optical clear adhesive (OCA)). The touch sensing layer 120 is disposed under the cover plate 110. With the touch sensing layer 120, the electronic device 100 can provide a touch sensing function. The display module 130 is disposed under the touch sensing layer 120. The polarizing layer 140 is disposed between the touch sensing layer 120 and the display module 130. The polarizing layer 140 is attached to the touch sensing layer 120 through the adhesive OCA1. The image displayed by the display module 130 can be viewed by the user sequentially through the multilayer structure disposed above the display module 130, so that the display function of the electronic device 100 can be provided. In some embodiments, the display module 130 is, for example, an organic light emitting display module or an electronic paper display module. The polarizing layer 140 is configured to achieve specific optical effects. For example, the polarizing layer 140 can block the reflection of external light to ensure that the image displayed by the display module 130 can maintain a high contrast. The metal plate 170 is disposed under the display module 130 and attached to the display module 130 through the adhesive OCA2. The pressure colloid 180 is disposed under the metal plate 170. The supporting member 190 is disposed under the pressure colloid 180.

In some embodiments, the touch sensing layer 120 can be structured as a single-side bridge (SITO) pattern, a single-layer non-cross pattern, etc., but the disclosure is not limited in this regard. The material of the touch sensing layer 120 can include a silver nanowire (SNW; also known as AgNW) electrode layer, a metal mesh, or an indium tin oxide (ITO) electrode layer, but the disclosure is not limited in this regard. In the embodiment where the touch sensing layer 120 is a silver nanowire electrode layer, the touch sensing layer 120 includes a substrate and silver nanowires doped therein. The silver nanowires overlap each other in the substrate to form a conductive network. The substrate refers to the non-nanosilver material formed by the solution including the silver nanowires through processes such as coating, heating, and drying. The silver nanowires are distributed or embedded in the substrate and partially protrude out from the substrate. The substrate can protect the silver nanowires from the external environment, such as from corrosion and abrasion. In some embodiments, the substrate is compressible.

In some embodiments, the touch sensing layer 120 may also be combined with an IAI stack structure in the SITO pattern (e.g., choosing an ITO-Al-ITO stack structure or a SNW-Al-SNW stack structure for one of the first axis electrodes or the second axis electrodes).

In some embodiments, the touch sensing layer 120 is disposed on and in contact with the lower surface of the cover plate 110. In some embodiments, the polarizing layer 140 is disposed on and in contact with the upper surface of the display module 130.

In some embodiments, the electronic device 100 may only have the touch function without the display function. In other words, the aforementioned display module 130 and the polarizing layer 140 may be omitted from the electronic device 100, and the metal plate 170 may be attached to the touch sensing layer 120 through one of the adhesives OCA1, OCA2.

As shown in FIG. 2, in the present embodiment, the cover plate 110 includes a glass layer 111 and transparent covering layers 112, 113. The glass layer 111 has a first surface 111a and a second surface 111b located at opposite sides, respectively. The touch sensing layer 120 is disposed on and in contact with the transparent covering layer 113, and the glass layer 111 is laminated between the transparent covering layers 112, 113. It can be seen that the transparent covering layers 112, 113 and the glass layer 111 are not adhered to each other with adhesive, so not only can the overall thickness of the cover plate 110 be reduced, but also the surface performance (e.g., wear resistance, hardness, etc.) of the cover plate 110 can be effectively improved. In addition, the lack of the use of adhesive can simplify the manufacturing process, thereby reducing manufacturing costs.

In some embodiments, the material of the transparent covering layers 112, 113 includes polyimide, but the disclosure is not limited in this regard.

In some embodiments, the glass layer 111 has a thickness from about 10 microns to about 300 microns; preferably, the glass layer 111 has a thickness from about 20 microns to about 100 microns (e.g., the optimal thickness is from about 25 microns to about 35 microns, and this range enables the glass layer 111 to have a sufficient stress support effect). Therefore, the glass layer 111 is an ultra-thin glass layer.

Figure 3:
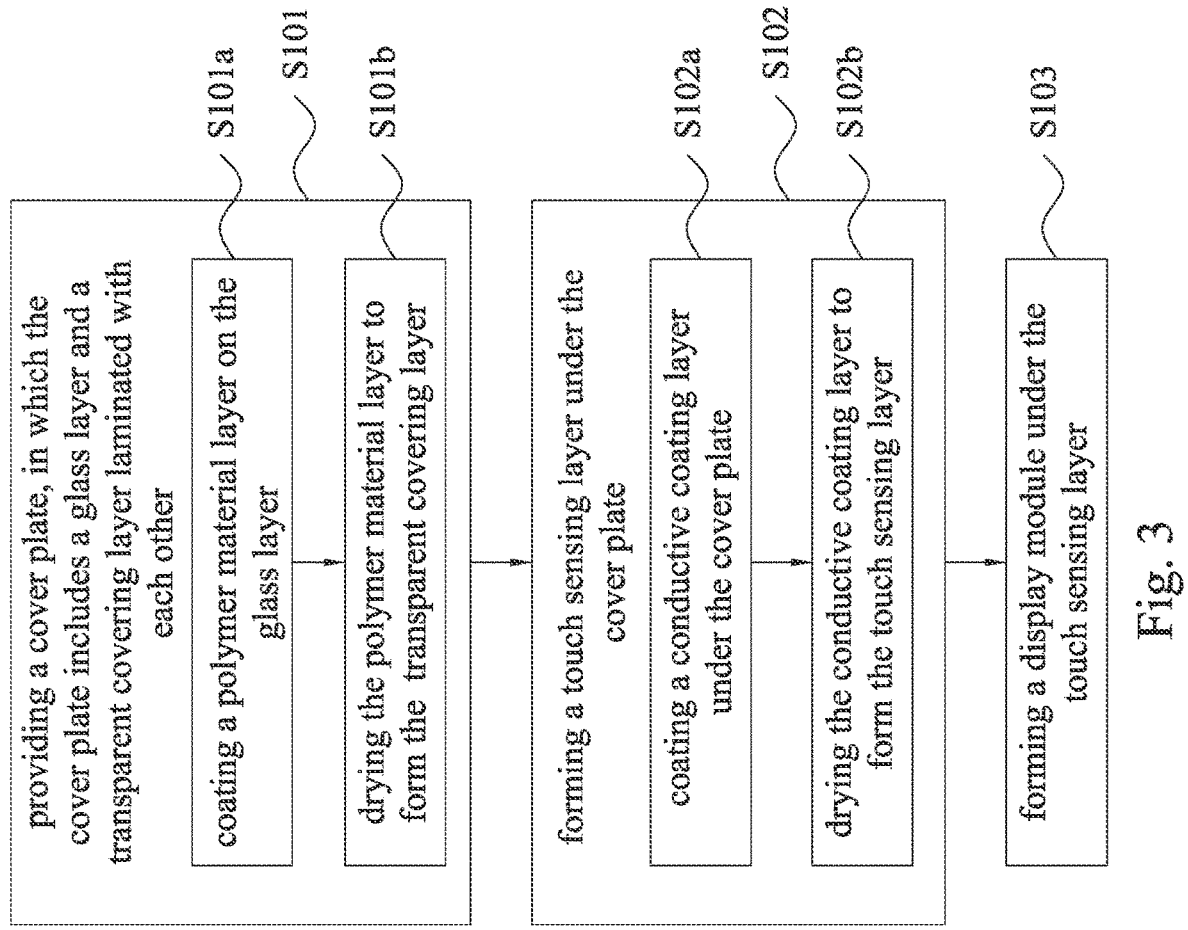
FIG. 3 is a flowchart of a method of manufacturing an electronic device according to an embodiment of the present disclosure.

Reference is made to FIG. 3. FIG. 3 is a flowchart of a method of manufacturing an electronic device according to an embodiment of the present disclosure. As shown in FIG. 3, the method of manufacturing an electronic device includes steps S101 to S103.

In step S101, a cover plate is provided, in which the cover plate includes a glass layer and a transparent covering layer laminated with each other.

In step S102, a touch sensing layer is formed under the cover plate.

In step S103, a display module is formed under the touch sensing layer.

In some embodiments, step S101 includes step S101a and step S101b.

In step S101a, a polymer material layer is coated on the glass layer.

In step S101b, the polymer material layer is dried to form the at least one transparent covering layer.

In some embodiments, step S102 includes step S102a and step S102b.

In step S102a, a conductive coating layer is coated under the cover plate.

In step S102b, the conductive coating layer is dried to form the touch sensing layer.

It can be seen from the above steps that at least one of the transparent covering layers 112, 113 is a dried polymer material layer. The polymer material layer preferably includes polyimide (PI) or colorless polyimide (CPI), but the disclosure is not limited in this regard. Preferably, a coatable liquid polyimide material (such as soluble polyimide (SPI)) is used, which has the characteristics of low hygroscopic expansion coefficient, low viscosity, and high transparency.

In some embodiments, at least one of the transparent covering layers 112, 113 has a thickness from about 3 microns to about 50 microns, and preferably from about 5 microns to about 15 microns (e.g., the optimal thickness is from about 5 microns to about 10 microns).

In some embodiments, as shown in FIG. 2, the electronic device 100 further includes an anti-reflection layer 150. The anti-reflection layer 150 is disposed on a side of the cover plate 110 away from the touch sensing layer 120.

In some embodiments, one of the transparent covering layers 112, 113 may be omitted. For example, when the transparent covering layer 113 is omitted, the touch sensing layer 120 is disposed on and in contact with the lower surface (i.e., second surface 111b) of the glass layer 111. When the transparent covering layer 112 is omitted, the anti-reflection layer 150 is disposed on and in contact with the upper surface (i.e., first surface 111a) of the glass layer 111.

In some embodiments, the polymer material layer is coated on the glass layer 111 by a slot die coating process, but the disclosure is not limited in this regard. In some embodiments, a drying temperature for drying the polymer material layer is from about 80 degrees Celsius to about 350 degrees Celsius, for example, from about 80 degrees Celsius to about 150 degrees Celsius or from about 200 degrees Celsius to about 350 degrees Celsius, but the disclosure is not limited in this regard.

In some embodiments, the polymer material layer also includes an organic solvent for dissolving polyamide acid in the coating stage to form a polymer coating layer. The organic solvent is, for example, methyl isobutyl ketone (MIBK), propylene glycol monomethyl etherate (PGMEA), isopropanol (IPA), dimethylacetamide (DMAC), and the like. The polymer material layer may further include a coupling agent. The content of the polyamide acid is preferably from about 3 wt % to about 15 wt %, and the added amount of the coupling agent is preferably from about 0.5 wt % to about 10 wt % of the content of the polyamide acid, but the disclosure is not limited in this regard. Anything that can be used as a solvent belongs to the scope of the organic solvent of the present disclosure.

In practical applications, the coating process used for the aforementioned disposing and contacting can also be changed to a sputtering process or a printing process.

In some embodiments, in order to further increase the Young's modulus of the cover plate 110, an inorganic mixture can be added to one or two layers of the transparent covering layer (i.e., one or both of the transparent covering layers 112, 113) in a liquid state. For example, the inorganic mixture may include graphene or diamond, preferably graphene dopants, but the present disclosure is not limited in this regard. In fact, the outstanding mechanical properties of graphene are high strength and high modulus, and a tensile Young's modulus of graphene can reach up to 200 GPa, so that the maximum Young's modulus of the composite cover plate tends to 200 GPa. It is worth mentioning that the hardness of graphene is higher than that of diamond with Mohs hardness level 10. Graphene also has good toughness, can be bent, and has excellent ductility. In some embodiments, the polymer material layer may further include nano particles such as silicon dioxide, which can improve the defects of insufficient hardness and increase the surface strength. Under the action of the coupling agent, transparent silica nanoparticles can be further dispersed to improve the dispersion stability of the transparent nanoparticles in the polymer material layer. In addition, the chemical reaction between the silanol group of silicon dioxide and the coupling agent can also improve the film hardness, thermal expansion coefficient, and other properties, and reduce the difference in physical properties between the one or two layers of the transparent covering layer (i.e., one or both of the transparent covering layers 112, 113) and the substrate (e.g., the glass layer 111).

In some embodiments, the viscosity of the polymer coating layer is from about 100 cps to about 5000 cps; preferably, the polymer coating layer has a viscosity of about 300 cps to about 1000 cps.

In some embodiments, the material of at least one of the transparent covering layers 112, 113 may also include transparent materials such as polyethylene naphthalate (PEN), polyvinylidene fluoride (PVDF), or polycarbonate (PC), but the disclosure is not limited in this regard.

In some embodiments, the glass layer 111 is an ultraviolet light absorbing glass layer. That is, the glass layer 111 has UV light absorption capability.

In some embodiments, as shown in FIG. 2, the electronic device 100 further includes a blackened layer 160. The blackened layer 160 is disposed at an edge of the glass layer 111 and is laminated between the glass layer 111 and the transparent covering layer 113. In addition to reducing Mura (that is, the phenomenon of various traces caused by uneven brightness), the blackened layer 160 can also avoid interference from the manufacturing process of the blackened layer 160 during the manufacturing process of the touch sensing layer 120.

According to the aforementioned parameters, the cover plate 110 may have a Young's modulus in the range of 10 Gpa to about 200 Gpa. In the present disclosure, it is notable that at least one of the transparent covering layers 112, 113 and the glass layer 111 are not adhered to each other by adhesive (e.g., OCA), and the coatable liquid polyimide is directly formed on and in contact with the glass layer 111. Therefore, not only can the overall thickness of the cover plate 110 be reduced, but also the surface performance (e.g., having the effects of stress buffering and anti-bending, abrasion resistance, hardness, and the like combined by the composite cover plate) of the cover plate 110 can be effectively improved. In addition, without the use of adhesive, the manufacturing process of the module can be simplified and the thickness can be reduced, such that the manufacturing cost can be reduced.

Figure 4:
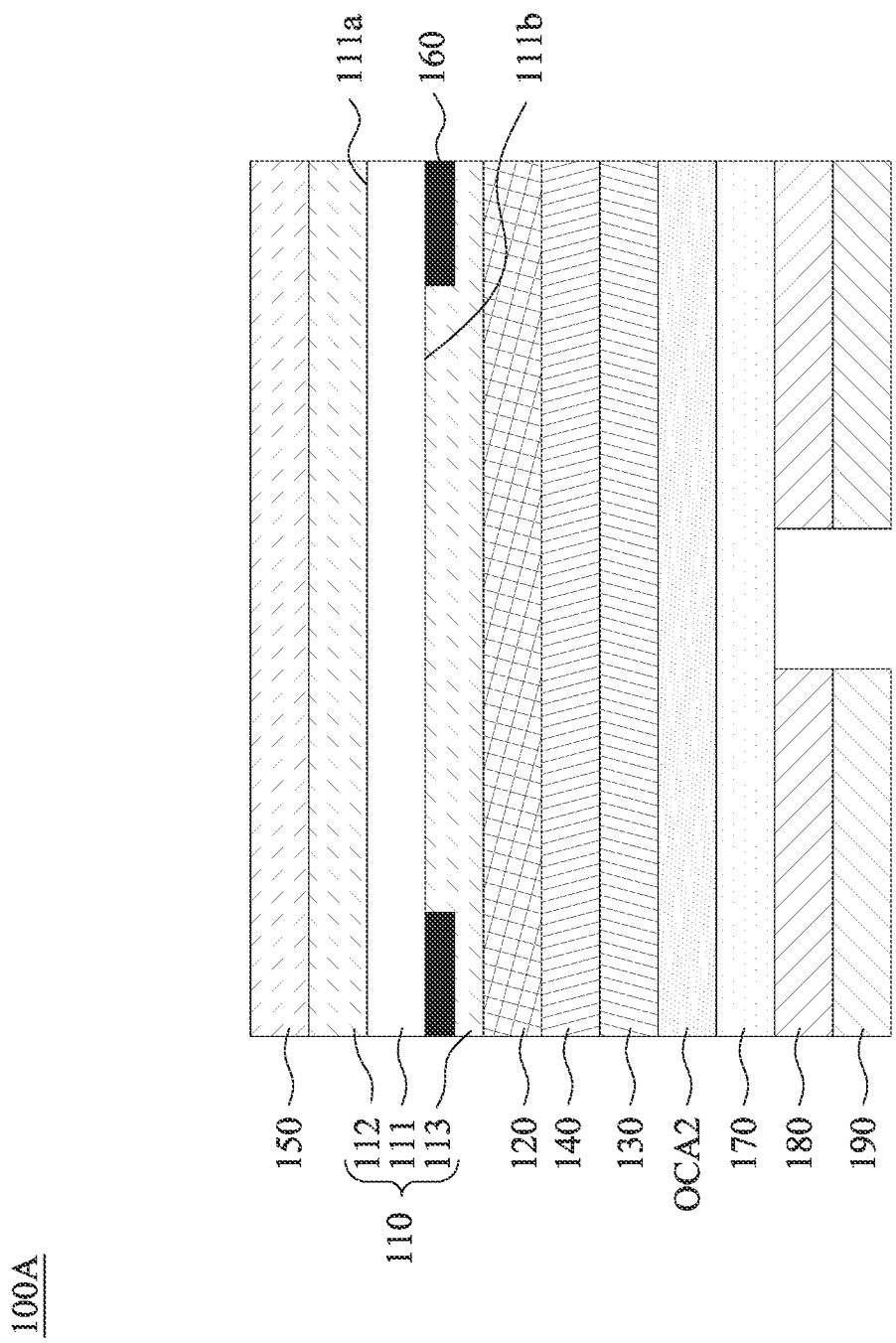
FIG. 4 is a schematic cross-sectional view of an electronic device according to another embodiment of the present disclosure.

Reference is made to FIG. 4. FIG. 4 is a schematic cross-sectional view of an electronic device 100A according to another embodiment of the present disclosure. A difference between the electronic device 100A of the present embodiment and the electronic device 100 shown in FIG. 2 is that the electronic device 100A of the present embodiment omits the adhesive OCA1 between the touch sensing layer 120 and the polarizing layer 140. In other words, the touch sensing layer 120 in the present embodiment is directly manufactured on the polarizing layer 140. After omission of the adhesive OCA1, the overall thickness of the electronic device 100 and the number of processes can be further reduced.

Reference is made to FIG. 5. FIG. 5 shows stress-strain curves of various structures, in which curve C1 is the stress-strain curve of a single-layer polyimide layer, curve C2 is the stress-strain curve of a single-layer glass layer, and curve C3 is the stress-strain curve of the composite laminated structure formed by the single-layer polyimide layer and the single-layer glass layer. As shown in FIG. 5, it can be seen from the curve C1 that the polyimide layer will deform greatly when subjected to external force. It can be seen from the curve C2 that the glass layer has a smaller deformation when subjected to an external force, and the reason for the smaller deformation is that the glass layer has a larger Young's modulus. It can be seen from the curve C3 that the composite laminated structure formed by the polyimide layer and the glass layer can achieve the comprehensive effect of the two materials, so the composite laminated structure can achieve better implementation effects in flexible folding applications. Specifically, the polyimide layer has better flexibility but poorer stress bearing capacity, and the glass layer has better Young's modulus, so the composite laminated structure of the two can bring sufficient overall flexibility and sufficient overall Young's modulus.

According to the foregoing recitations of the embodiments of the disclosure, it can be seen that in the electronic device of the present disclosure, the transparent covering layer is disposed on and in contact with the glass layer. In other words, the transparent covering layer and the glass layer are not adhered to each other with adhesive. Therefore, not only can the overall thickness of the cover plate be reduced and the formation of pores and unnecessary cracks during the bending process be reduced, but also the surface performance (e.g., bending resistance, stress resistance, abrasion resistance, and hardness) of the cover plate can be effectively improved. In addition, the lack of the use of adhesive can simplify the manufacturing process, thereby reducing manufacturing costs.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:
1. An electronic device, comprising:
 a cover plate comprising:
  a glass layer having a first surface and a second surface; and
  at least one transparent covering layer disposed on and in contact with at least one of the first surface or the second surface of the glass layer and laminated with the glass layer, wherein:
   the at least one transparent covering layer comprises a first transparent covering layer and a second transparent covering layer, and
   the glass layer is laminated between the first transparent covering layer and the second transparent covering layer;
 a touch sensing layer disposed under the cover plate; and
 a display module disposed under the touch sensing layer.
2. The electronic device of claim 1, wherein the glass layer is an ultra-thin glass layer having a thickness of less than about 100 microns.
3. The electronic device of claim 2, wherein the thickness of the glass layer is from about 25 microns to about 100 microns.
4. The electronic device of claim 3, wherein the thickness of the glass layer is from about 25 microns to about 35 microns.

5. The electronic device of claim 1, wherein each of the first transparent covering layer and the second transparent covering layer has a thickness from about 5 microns to about 10 microns.

6. The electronic device of claim 1, wherein the cover plate has a Young's modulus of about 10 Gpa to about 200 Gpa.

7. The electronic device of claim 1, wherein at least one of the first transparent covering layer or the second transparent covering layer comprises polyimide or colorless polyimide (CPI).

8. The electronic device of claim 1, wherein at least one of the first transparent covering layer or the second transparent covering layer is added with an inorganic mixture, and a Young's modulus of the cover plate compounded with the inorganic mixture is from about 80 Gpa to about 200 Gpa.

9. The electronic device of claim 1, wherein the display module is an organic light emitting display module or an electronic paper display module.

10. The electronic device of claim 1, wherein the touch sensing layer is spaced apart from the glass layer by one of the first transparent covering layer or the second transparent covering layer.

11. The electronic device of claim 1, wherein the touch sensing layer is in contact with one of the first transparent covering layer or the second transparent covering layer.

12. The electronic device of claim 1, further comprising:
an anti-reflection layer disposed on a side of the cover plate away from the touch sensing layer.

13. The electronic device of claim 1, further comprising:
a polarizing layer disposed between the touch sensing layer and the display module.

14. The electronic device of claim 13, wherein the polarizing layer is in contact with the touch sensing layer.

15. The electronic device of claim 13, wherein the polarizing layer is attached to the touch sensing layer through an adhesive.

16. The electronic device of claim 1, further comprising:
a blackened layer disposed at an edge of the glass layer.

17. The electronic device of claim 1, further comprising:
a first screen; and
a second screen rotatably connected to the first screen, wherein the cover plate covers the first screen and the second screen.

18. The electronic device of claim 17, wherein the first screen and the second screen are touch display screens.

19. The electronic device of claim 18, wherein each of the touch display screens comprises a force sensing layer.

20. The electronic device of claim 1, wherein the electronic device is a folding mobile phone.

21. A method of manufacturing an electronic device, comprising:
providing a cover plate, wherein:
the cover plate comprises a glass layer, a first transparent covering layer and a second transparent covering layer, and
the glass layer is laminated between the first transparent covering layer and the second transparent covering layer;
forming a touch sensing layer under the cover plate; and
forming a display module under the touch sensing layer.

22. The method of claim 21, wherein the providing the cover plate comprises:
coating a polymer material layer on the glass layer; and
drying the polymer material layer to form at least one of the first transparent covering layer or the second transparent covering layer.

23. The method of claim 21, wherein the forming the touch sensing layer under the cover plate comprises:
coating a conductive coating layer under the cover plate; and
drying the conductive coating layer to form the touch sensing layer.

24. An electronic device, comprising:
a cover plate comprising:
a glass layer having a first surface and a second surface; and
at least one transparent covering layer disposed on and in contact with at least one of the first surface or the second surface of the glass layer and laminated with the glass layer, wherein:
the at least one transparent covering layer comprises polyimide or colorless polyimide (CPI),
the at least one transparent covering layer is added with an inorganic mixture comprising graphene, and
a Young's modulus of the cover plate compounded with the inorganic mixture is from about 80 Gpa to about 200 Gpa;
a touch sensing layer disposed under the cover plate; and
a display module disposed under the touch sensing layer.

* * * * *